United States Patent [19]
Larson

[11] Patent Number: 5,442,549
[45] Date of Patent: Aug. 15, 1995

[54] DIAGNOSTIC VEHICLE ALIGNMENT SYSTEM

[75] Inventor: Timothy A. Larson, Ferguson, Mo.

[73] Assignee: Hunter Engineering Company, Bridgeton, Mo.

[21] Appl. No.: 73,185

[22] Filed: Jun. 8, 1993

[51] Int. Cl.⁶ .......................... G01B 5/20; G01F 15/00
[52] U.S. Cl. .................. 364/424.01; 364/424.03; 364/424.05; 364/562; 364/188; 33/288; 356/155
[58] Field of Search ............ 364/424.01, 424.03, 364/424.04, 551.01, 559, 188, 562; 33/203.18, 286, 288; 356/155; 395/54, 60, 77, 161, 162; 371/16.1, 21.2, 24, 27, 11.3

[56] References Cited
U.S. PATENT DOCUMENTS

| | | | |
|---|---|---|---|
| 4,060,915 | 12/1977 | Conway | 35/9 A |
| 4,381,548 | 4/1983 | Grossman et al. | 364/551 |
| 4,404,639 | 9/1983 | McGuire et al. | 364/551 |
| 4,441,359 | 4/1984 | Ezoe | 73/117 |
| 4,899,292 | 2/1990 | Montaga et al. | 364/521 |
| 4,931,964 | 6/1990 | Titsworth et al. | 364/559 |
| 4,977,524 | 12/1990 | Strege et al. | 364/562 |
| 4,985,857 | 7/1991 | Bajpai et al. | 364/551.01 |
| 5,006,998 | 4/1991 | Yasunobu et al. | 395/77 |
| 5,195,029 | 3/1993 | Murai et al. | 364/184 |
| 5,218,669 | 6/1993 | Kobayashi et al. | 395/51 |
| 5,261,086 | 11/1993 | Shiramizu | 395/575 |
| 5,307,446 | 4/1994 | Araki et al. | 395/77 |
| 5,313,388 | 5/1994 | Cortis | 364/424.04 |

*Primary Examiner*—Kevin J. Teska
*Assistant Examiner*—Tan Nguyen
*Attorney, Agent, or Firm*—Polster, Lieder, Woodruff & Lucchesi

[57] ABSTRACT

A diagnostic vehicle alignment system includes an electronic controller for guiding a user through a series of diagnostic steps to determine probable causes for particular vehicle symptoms. Vehicle wheel alignment measuring instruments determine the alignment of at least one wheel of the vehicle. An input device is manually operable by a user for providing symptom identification and answers to diagnostic questions. A digital memory stores a set of possible causes for each selectable symptom and also stores diagnostic questions and an identification of diagnostic procedures. The stored diagnostic questions and procedures are preselected to eliminate possible causes of the selected symptom from consideration. A display is provided for displaying diagnostic questions and procedures to the user. The electronic controller is responsive to the selection of a particular symptom to cause the display to display diagnostic questions associated with that symptom to the user as well as the display of instructions to the user to perform diagnostic procedures, and the user uses the input device to interactively supply answers to the diagnostic questions and diagnostic procedure results to the electronic controller. The electronic controller is responsive to user provided input and to information from the vehicle wheel alignment measuring instruments to eliminate at least one possible cause of a symptom from consideration and identify any remaining possible causes of the symptom.

57 Claims, 6 Drawing Sheets

DIAGNOSTIC VEHICLE ALIGNMENT SYSTEM

BACKGROUND OF THE INVENTION

The present invention relates to vehicle alignment, and more particularly to vehicle alignment systems which assist in diagnosing vehicle alignment symptoms.

Vehicle suspension and steering components are subject to wear, misadjustment, and failure. This results in various symptoms which, however, do not always unambiguously indicate the particular component which needs to be replaced or adjusted. Moreover, it is not always possible for the technician/user, particularly one who works on a great number of different models and makes of vehicles, to quickly and accurately determine the actual cause of any particular symptom. This results in increased repair time and costs and the possible replacement of undamaged parts.

There are books available which may be used by the technician to diagnose a particular problem or symptom, but the books are not always available to the technician at the time they are needed. In addition, the books are bulky, are easily soiled, and generally are not a satisfactory solution.

Various alignment equipment is available to the technician to assist in determining whether various alignment angles, such as toe, caster and camber are within specifications, but this information alone still does not always unambiguously define the cause of a particular symptom. Rather the currently available alignment equipment may direct the technician toward fixing a problem which is not actually the cause of the symptom complained of by the driver. When the symptom continues after the repair indicated by the alignment equipment, the driver will be dissatisfied. Such alignment equipment could be improved.

SUMMARY OF THE INVENTION

Among the various objects and features of the present invention is the provision of a vehicle alignment system which guides the technician through a process to diagnose the probable causes of vehicle symptoms.

A second object is the provision of such a system which integrates information from the vehicle alignment system sensors.

A third object is the provision of such a system which reduces the amount of knowledge required of the technician.

A fourth object is the provision of such a system which reduces technician uncertainty.

A fifth object is the provision of such a system which is usable with stored alignment measurements or with "live" alignment measurements, under control of the technician.

A sixth object is the provision of such a system which includes asking the technician various diagnostic questions, as well as instructing the technician to perform various diagnostic procedures.

A seventh object is the provision of such a system which provides additional information to the technician during the diagnostic process to facilitate the technician's job.

An eighth object is the provision of such a system which informs the technician at all times concerning the current state of the diagnostic process and, upon request, the probable causes of the symptom.

A ninth object is the provision of such a system which provides the technician with a list of probable causes of the symptom in order of probability.

Other objects will be in part apparent and in part pointed out hereinafter.

Briefly, a diagnostic vehicle alignment system of the present invention includes an electronic controller for guiding a user through a series of diagnostic steps to determine probable causes for particular vehicle symptoms. Vehicle wheel alignment measuring instruments determine the alignment of at least one wheel of the vehicle and supply that information to the electronic controller. An input device is manually operable by a user to provide input from the user to the electronic controller. The input device, for example, is operable by the user to select and supply to the electronic controller an identification of a particular symptom which the user desires to diagnose. A digital memory is provided for storing a set of possible causes for each selectable symptom and for storing diagnostic questions and an identification of diagnostic procedures for each selectable symptom. The stored diagnostic questions and procedures are preselected to eliminate possible causes of the selected symptom from consideration. A display is operatively connected to the electronic controller for displaying diagnostic questions and procedures to the user, the electronic controller being responsive to the selection of a particular symptom to cause the display to display at least one diagnostic question associated with that symptom to the user. The input device is operable by the user to supply an answer to the diagnostic question or the results of the diagnostic procedure to the electronic controller.

BRIEF DESCRIPTION OF THE DRAWINGS

Similar reference characters indicate similar parts throughout the several views of the drawings.

DESCRIPTION OF THE PREFERRED EMBODIMENT

Figure 1:
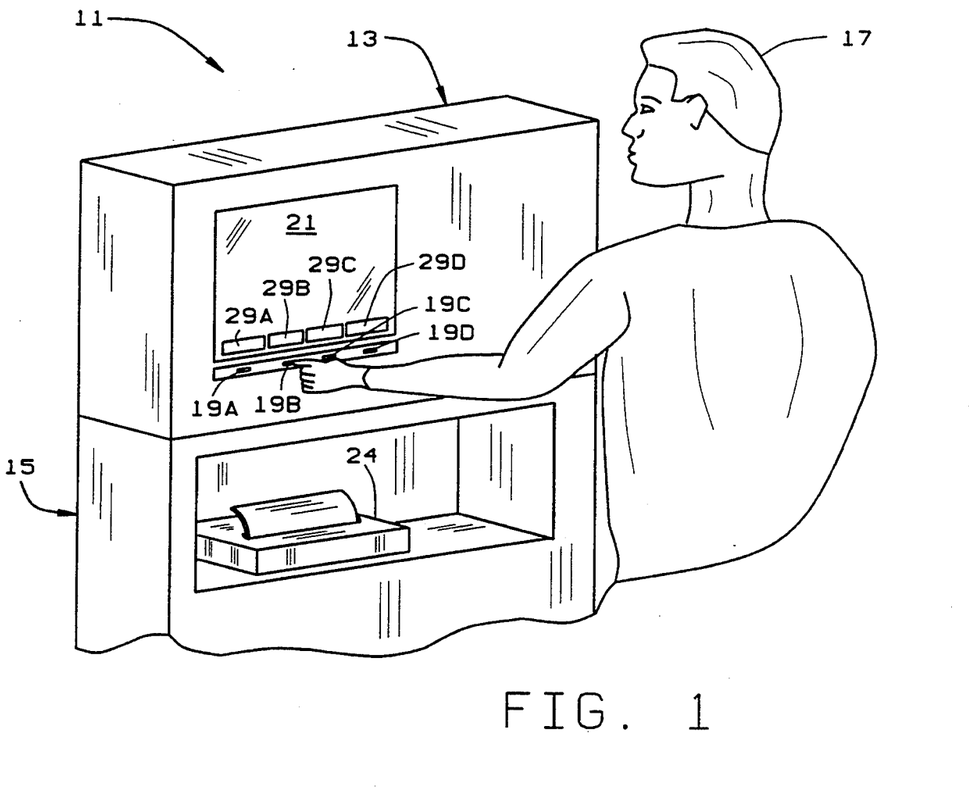
FIG. 1 is a perspective view of a diagnostic vehicle alignment system console of the present invention with a technician/user.
Figure 2:
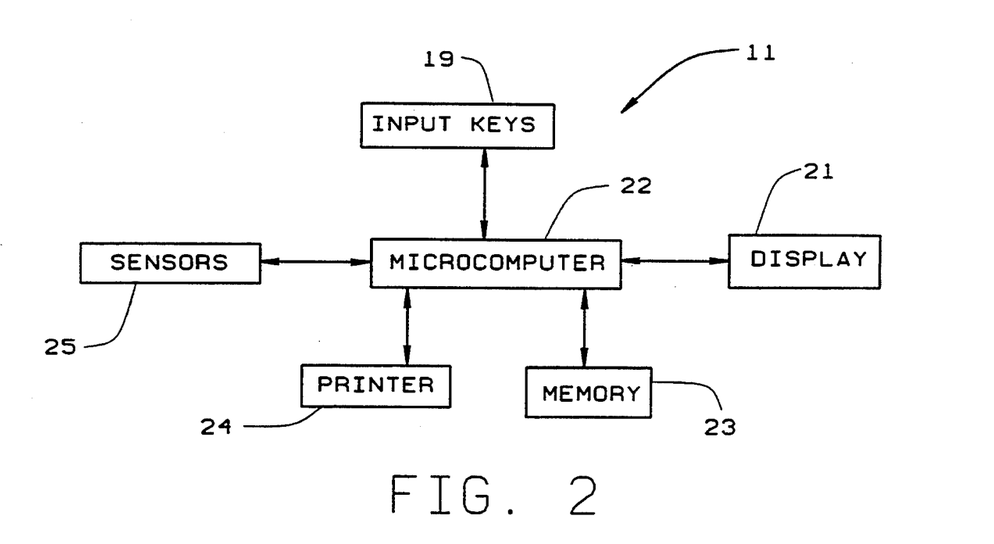
FIG. 2 is a block-diagram of the circuitry of the system of FIG. 1.

Turning to the drawings, and more particularly to FIGS. 1 and 2, there is shown a diagnostic vehicle alignment system 11 of the present invention. Alignment system 11 includes a console 13 suitably mounted on a stand 15 for use by a technician/user 17. Console 13 includes a set of manually operable input keys or switches 19(A–D) and a display 21. Display 21 is preferably a CRT computer monitor type display.

Input keys 19 and display 21 are connected to a microcomputer 22 which functions as an electronic controller to control the operation of system 11 and to guide technician 17 through the process of diagnosing vehicle symptoms. Any number of different microcomputers may be used in system 11, depending upon the other requirements of the system. Microcomputer 22 is also shown in FIG. 2 connected to a digital memory 23 and to a printer 24. It should be understood that memory 23 could be internal to microcomputer 22, depending upon the particular microcomputer used. In addition, other peripheral devices, such as a CD ROM drive and the like (not shown) could be connected to microcomputer 22 as desired. It is preferred that suitable alignment sensors 25 be operatively connected to microcomputer 22 for supplying alignment information to the microcomputer. The use of such sensors to measure alignment characteristics is, of course, well known. See, U.S. Pat. Nos. Re 33,144 to Hunter et al., and 4,381,548 to Grossman et al., the disclosures of which are incorporated herein by reference.

System 11 is particularly suited for use by technician 17 in performing a diagnosis of vehicle alignment symptoms or problems. In the present invention the microcomputer works interactively with the technician to guide the diagnostic procedure and perform the diagnosis. This is done by means of display 21, which the microcomputer uses to present diagnostic questions and the identification of diagnostic procedures to the technician, and by means of input keys 19, which the technician uses to initially identify the symptom for the microcomputer, and to provide answers to the diagnostic questions.

It should be noted that the bottom of display 21 contains four variable function blocks 29A-D (the display of which is controlled by microcomputer 22). Function blocks 29A-D are disposed directly over corresponding switches 19A-D and display to the user the function of those switches at that particular time in the program which controls the operation of microcomputer 22.

The diagnostic system of the present invention is capable of diagnosing vehicle problems based on information that it receives from the technician 17, the sensors 25, and the customer and specifications databases. Database information is prestored in memory 23 for various makes and models of vehicles.

The diagnostic system is an expert system that uses a knowledge base of information regarding vehicle alignment. A knowledge base is a set of rules and facts that, when used together, can diagnose problems. Rules are if—then constructs that hold knowledge such as "If there is feather edge tire wear, then there may be an excessive toe angle". The particular knowledge base of information is a matter of individual choice and forms no part of the present invention. Any such knowledge base is equally usable with the present invention.

In overview, the diagnostic system interactively diagnoses problems by prompting the technician 17 through a series of questions displayed on CRT display 21. The system begins by asking the technician for a major symptom and then proceeds to narrow down the cause of the problem by asking a series of questions. Microcomputer 22 asks a minimum number of relevant questions. Before asking each question, microcomputer 22 considers the answers to all the preceding questions in order to determine the best question to ask next. The system, if desired, may also ask the technician to perform simple diagnostic procedures such as rotating tires in order to locate the cause of the problem. The diagnostic questions and the identification of diagnostic procedures are stored in memory 23 for use as needed in diagnosing a selected symptom.

Vehicle alignment system 11 operates in a plurality of modes. One mode is the diagnostic mode, described in detail herein. System 11 also includes an alignment mode, and may include such other modes as an inspection mode, etc. At any time in the diagnostic mode, the technician can ask system 11 to produce a report on what it knows about the vehicle and what it can deduce from its knowledge, as described below. The report may be displayed on display 21, or printed on printer 24, or both.

System 11 further keeps track of any information that it gathers during a particular diagnostic procedure or "Work Order". The technician may enter and exit from the diagnostic mode as desired. During the time the technician is exited from the diagnostic mode, microcomputer 22 maintains the answers to the questions that is has already asked the technician, so that upon re-entering the diagnostic mode that information is immediately available. Other information, such as sensor measurements from sensors 25 which might change in the interim, is not saved. Sensor data is updated during the alignment mode, and the updated values are used upon re-entering the diagnostic mode. Of course, the sensor data could be acquired during the diagnostic mode itself, although this could complicate the diagnostic process if the sensor values were allowed to change during the diagnostic process itself.

As briefly mentioned above, system 11 is not limited to information from the technician. It gathers information from databases, from the sensors and from the technician. Following are some examples of the types of information that the diagnostic system collects and typical sources of the information:

| Information | Source |
| --- | --- |
| Suspension type | Spec. Database |
| Steering System type | Spec. Database |
| Mileage | Customer Database or by asking technician |
| Vehicle Configuration | From Spec. database or from technician |
| How is the Vehicle being used | Ask technician/customer |
| Camber, Caster, Toe | From the sensors or from saved job information |
| What modifications have been made to the vehicle | Ask technician |

Figure 3:
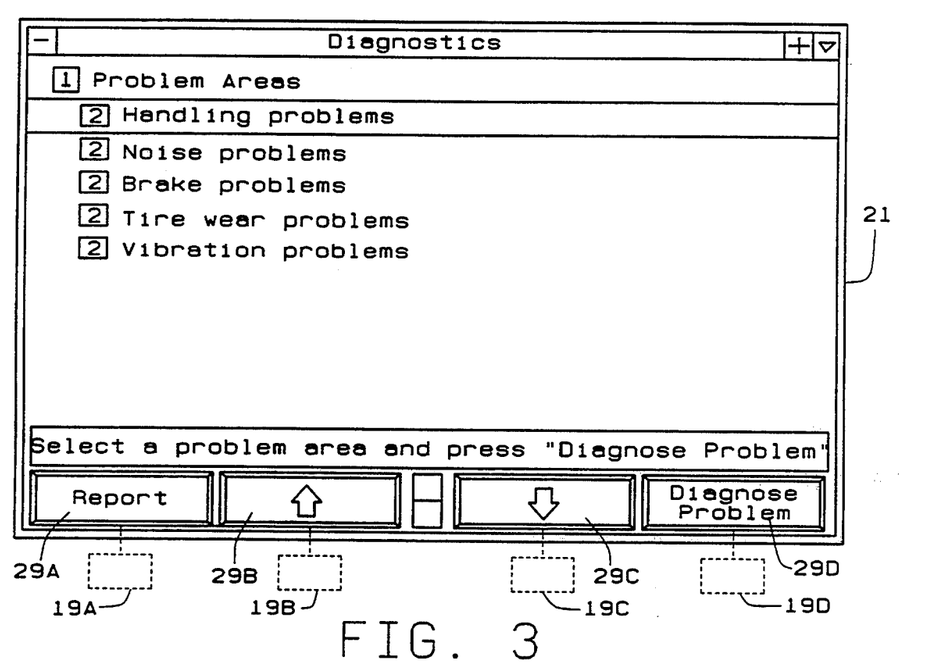
FIGS. 3-10 are examples of screens displayed by the system of FIG. 1 to the user on the console of FIG. 1.

The technician may enter the diagnostic mode from any of the "Primary" screens (not shown) in the vehicle alignment system. These Primary screens form no part of the present invention. Upon entering the diagnostic mode, microcomputer 22 causes the screen shown in FIG. 3 to be displayed on display 21 to technician 17. As shown in FIG. 3, in the diagnostic mode, microcomputer 22 first presents the technician with a hierarchical list of problems. The "2" symbol on this screen indicates that there are items at a lower level in the hierarchy. The "1" symbol indicates that the items at the lower level are currently displayed.

At the bottom of the screen shown in FIG. 3, microcomputer 22 causes the display in blocks 29A-29D of the following: "Report", up-arrow, down-arrow, and "Diagnose Problem." By pressing the corresponding switch 19A-19D associated therewith, the technician may move through the screen and move to other screens. For example, by pressing switch 19C associated with block 29C (the down-arrow in this part of the program), the technician moves down the list of problem types shown in FIG. 3. Likewise, pressing switch 19B (associated with the up-arrow) moves the indicator up the list of problem types. Once the desired problem type on the screen of FIG. 3 is highlighted, the user presses switch 19D (associated with "Diagnose Problem"), which results in microcomputer 22 causing the display of the subsequent screen, in this case the screen illustrated in FIG. 4.

Figure 4:
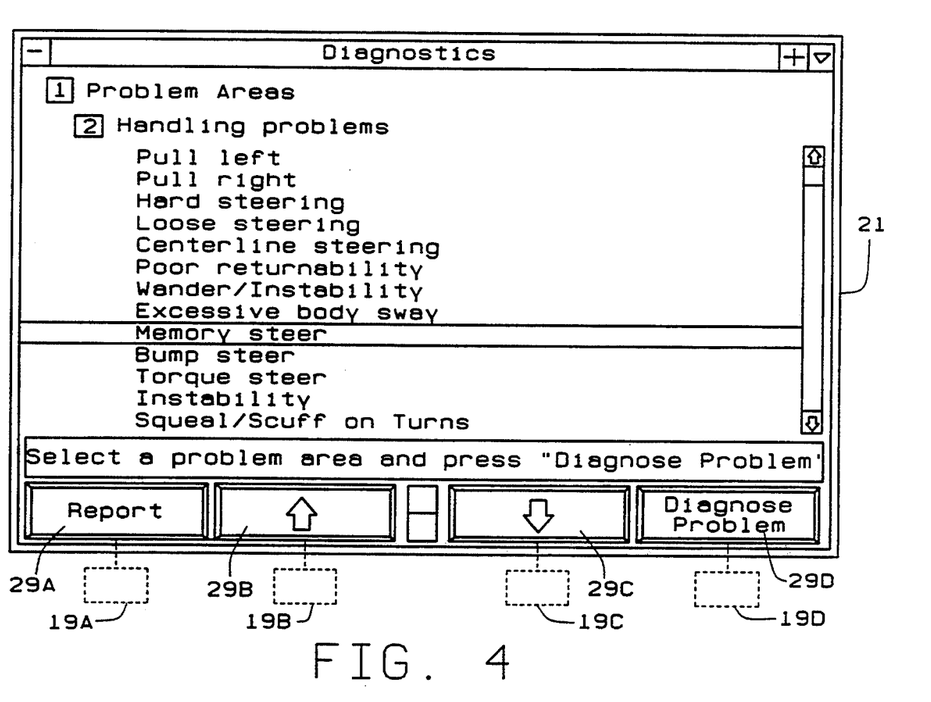

After the technician has selected a broad category of problems from the first list, he/she selects the precise problem or symptom from subsequent screens such as the one shown in FIG. 4. This is done by using switches 19B and 19C to highlight the precise symptom on screen 21, and then using switch 19D to proceed with the diagnostic procedure.

Figure 4A:
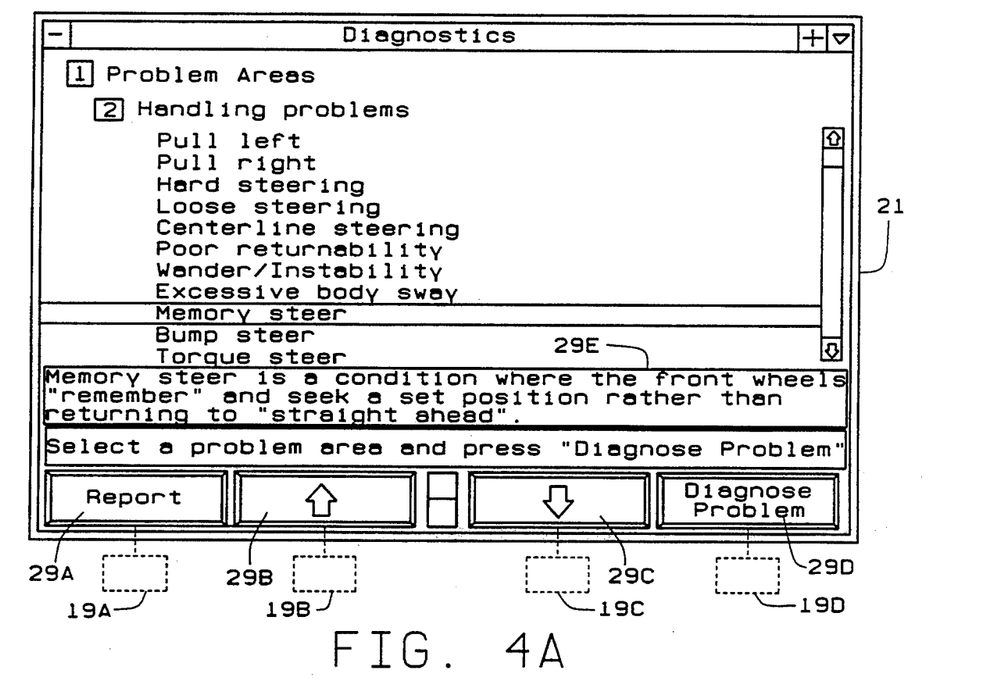

If desired, as shown in FIG. 4A, microcomputer 22 can aid the technician by displaying in a display block 29E the definition for each item as the technician moves through the list of items. For example, in FIG. 4A, the problem "memory steer" is highlighted and in display block 29E microcomputer 22 causes the display of the following definition: "Memory steer is a condition where the front wheels "remember" and seek a set position rather than returning to "straight ahead.""

It should be understood that the legends in the display blocks 29 are under complete control of microcomputer 22. In addition to those legends shown, various alternative legends can be displayed by the microcomputer to enter different modes and to perform other functions. Of the legends displayed, the "Report" legend is used to produce a report of the problem, the known facts and the possible causes, as discussed in detail below. The function of the up-arrow and down-arrow legends has already been discussed. The "Diagnose Problem" legend, as discussed above, is used to begin the diagnostics process by further qualifying the problem or by prompting the technician with a definition of the problem.

The user may instruct the microcomputer at any time (by a switch not shown) to display other legends. These legends for the particular screens shown in FIGS. 4 and 4A include a set of legends "Job Management", "Vehicle Specs", "Vehicle Measurements", and "Vehicle Inspection" for instructing the microcomputer to move to the primary screens for those functions. It should be understood that the diagnostic mode is fully integrated with these other functions. In particular, the technician/user is able to move to various modes of the aligner which may have some effect on the diagnostics. For example, in the Vehicle Specs mode, the technician may access the specification database. If the technician changes the specifications of a vehicle, the diagnosis may change. That is, measurements that once were within specifications, may now fall out of specifications. Or a technician may recall a vehicle with a different suspension type which may lead to a different diagnosis.

Similarly, in the Vehicle Measurements mode, the technician may observe measurements from sensors 25 attached to the vehicle. In this mode, he/she may make adjustments to the vehicle. Any changes that the technician makes in this mode is reflected subsequently in the diagnostic mode.

Likewise, in the Vehicle Inspection mode, the technician inspects a vehicle in order to produce a report of what parts of the vehicle are worn or damaged. If the fact that a part is worn is relevant to the problem that is being diagnosed, microcomputer 22 will recognize the fact that the technician identified the worn part in the Inspection mode, and will use that information subsequently in the diagnostic mode.

Additional legends such as "Clear All Answers" and "Help" are also displayable. Pressing "Clear all Answers" causes the microcomputer to clear all answers to all the questions that the technician has answered to that point in the procedure. The "Help" legend is self-explanatory.

After the technician has identified a problem in the initial hierarchical list of problems, the system may need to qualify the problem further. For example, if the technician selects Tire Wear, microcomputer 22 may qualify the type of tire wear with a screen like that shown in FIG. 5.

Figure 5:
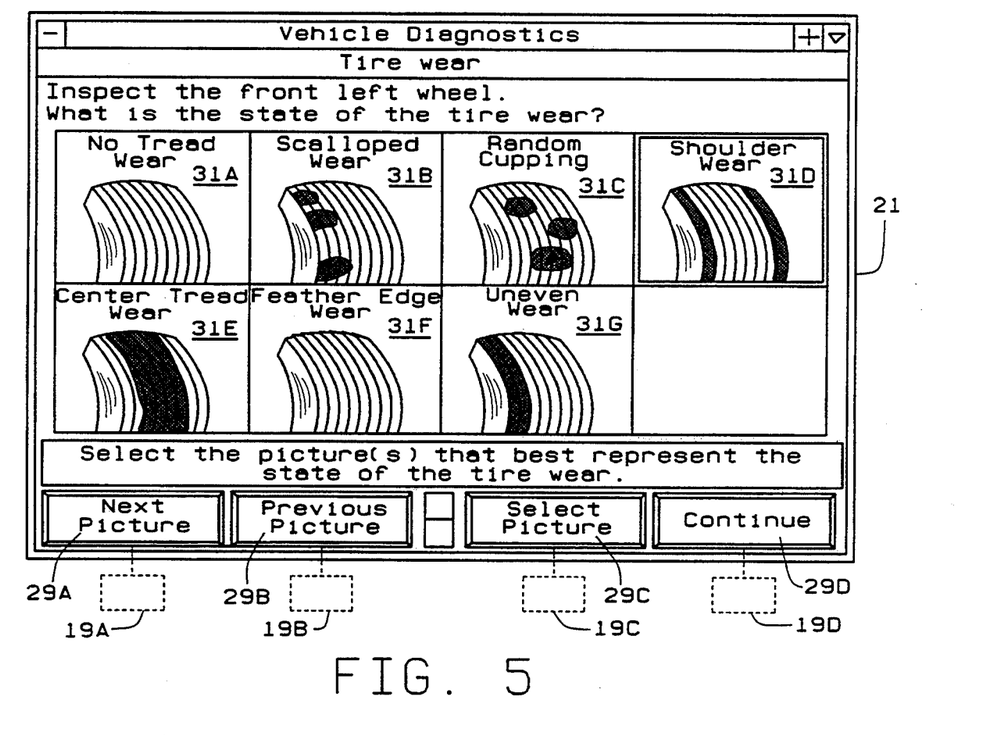

In this type of screen various types of wear are illustrated in selectable panes 31A-31G. The technician uses switches 19A (associated with "Next Picture") and 19B (associated with "Previous Picture") to highlight the pane which best illustrates the state of wear, and then uses switch 19C (associated with "Select Picture") to select that particular pane. Although this feature is illustrated with respect to tire wear, it should be appreciated that it is applicable as well to other types of wear and symptoms.

Figure 6:
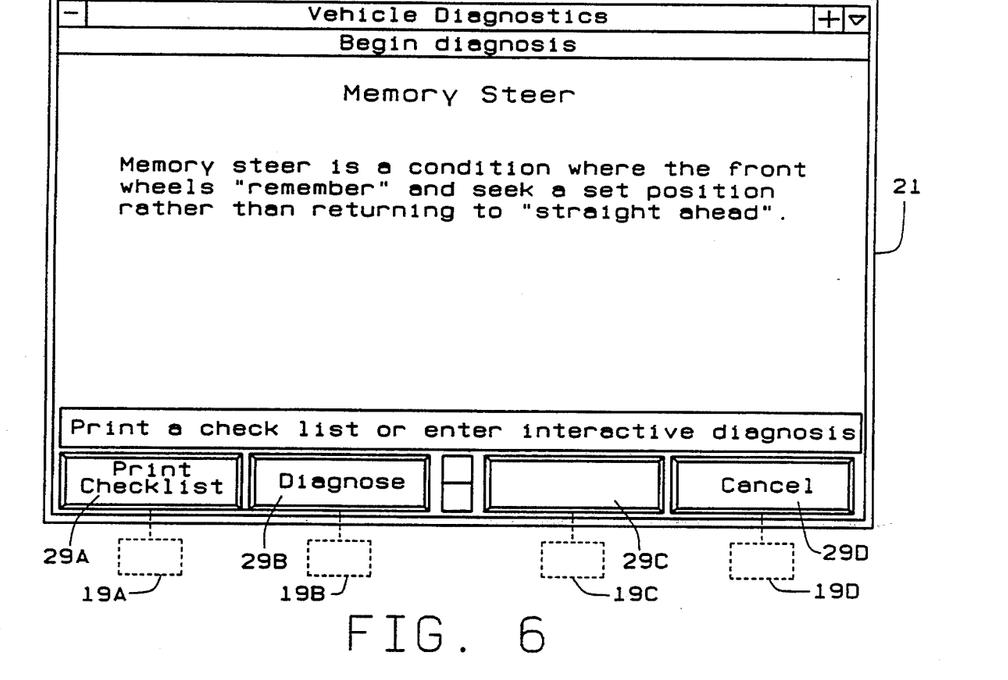

After the technician has selected a problem or symptom through the use of screens like those of FIGS. 4, 4A, and/or 5, microcomputer 22 causes the display on display 21 of a screen that defines the problem (see FIG. 6). This screen lets the technician decide if he/she wants a printed checklist or interactive diagnosis. If the technician selects "Print Checklist" by pressing switch 19A, microcomputer 22 will cause printer 24 to print out a printed report that can be used to diagnose the car without the computer. The report can also be used to talk to the customer without the aid of the computer, or to use in a road test of the vehicle.

Figure 7:
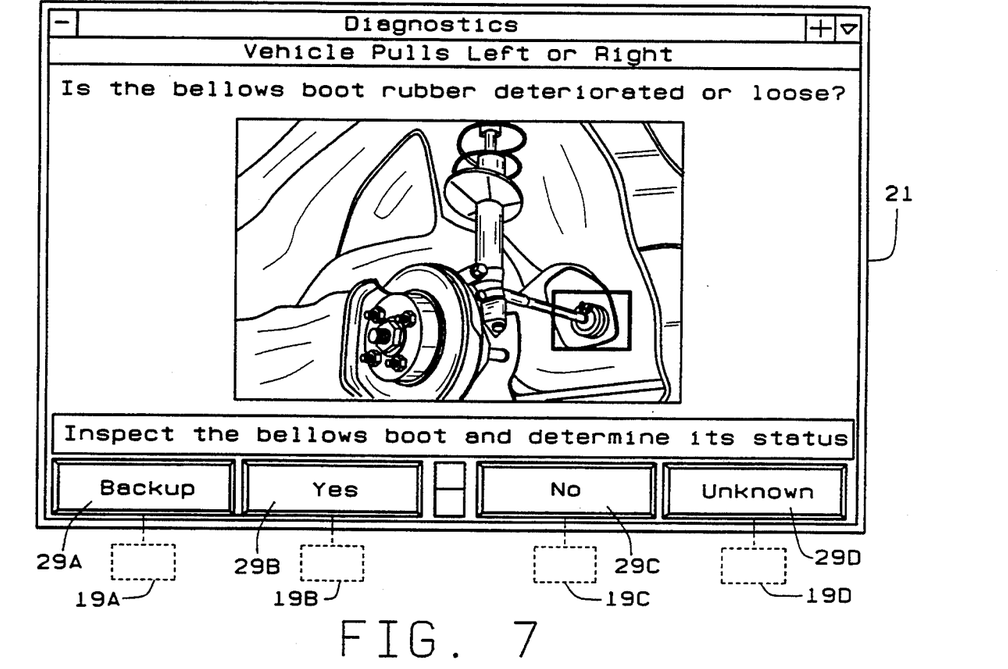

If the technician selects "Diagnose" (presses switch 19B), microcomputer 22 will cause the display of diagnostic questions and instruct the technician to perform diagnostic procedures. Whenever possible, microcomputer 22 will cause the display of diagnostic questions using pictures, such as illustrated in FIG. 7. These pictures are preferably actual photographs of the portion of the vehicle in question, although line art may also be used. As can be seen in FIG. 7, these diagnostic question screens with pictures include not only a picture and a diagnostic question, but also some indication (the box 35 in FIG. 7) highlighting the part to be inspected. The technician at this point has the option to back up one screen in the procedure (by pressing switch 19A), answering the question "yes" (by pressing switch 19B), answering the question "no" (by pressing switch 19C), or by answering the question as "unknown" (by pressing switch 19D).

Figure 8:
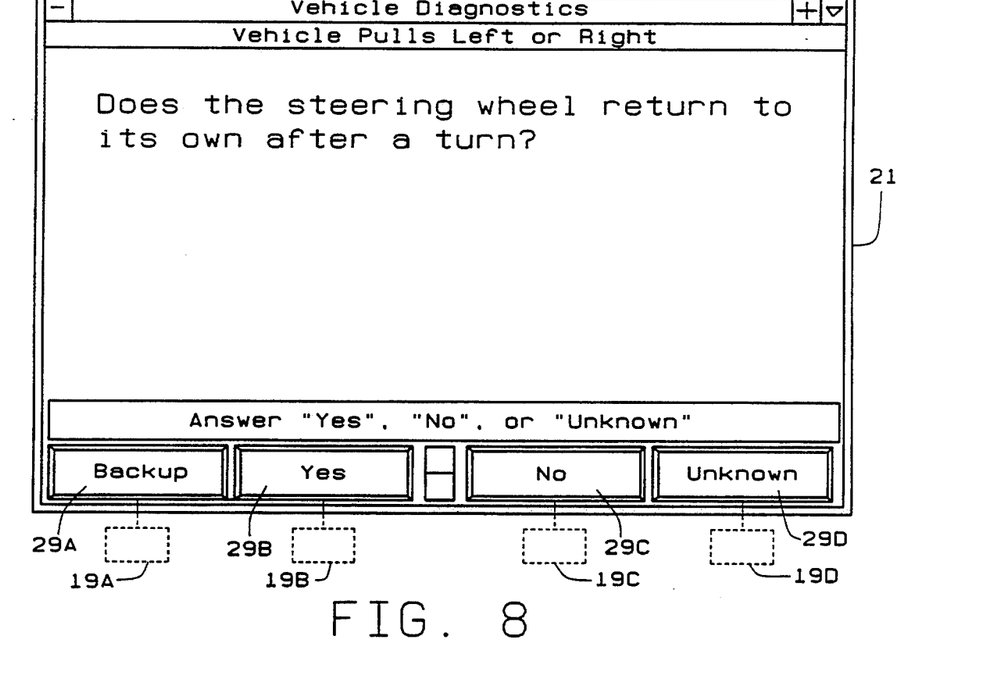

In many instances, microcomputer 22 causes the display of diagnostic questions without the aid of pictures, as shown in FIG. 8. In addition to the answer display blocks for the screens of FIGS. 7 and 8 discussed above, the microcomputer may at the technician's request also cause the display of the following legends "Report" (which results in the production of a report of the problem, the known facts and the possible causes), "Return To Problem List" (which results in returning to the main problem diagnostic screen), and "Restart Diagnosis" (which results in the clearing of all answers for the current diagnosis). If the technician choses to return to the main screen, he/she may at that point diagnose another problem or reenter the diagnosis for the current problem.

Microcomputer 22 will often need measurement information. It obtains this information from sensors 25 in the conventional way during the alignment mode. Microcomputer 22 also, when using measurement information, informs the technician of this fact by the display of a screen such as that shown in FIG. 9. For example, if the microcomputer requires left front camber information during a diagnosis, then display 21 informs the technician of the fact that left front camber information is being used, along with the results of the camber measurement.

Figure 9:
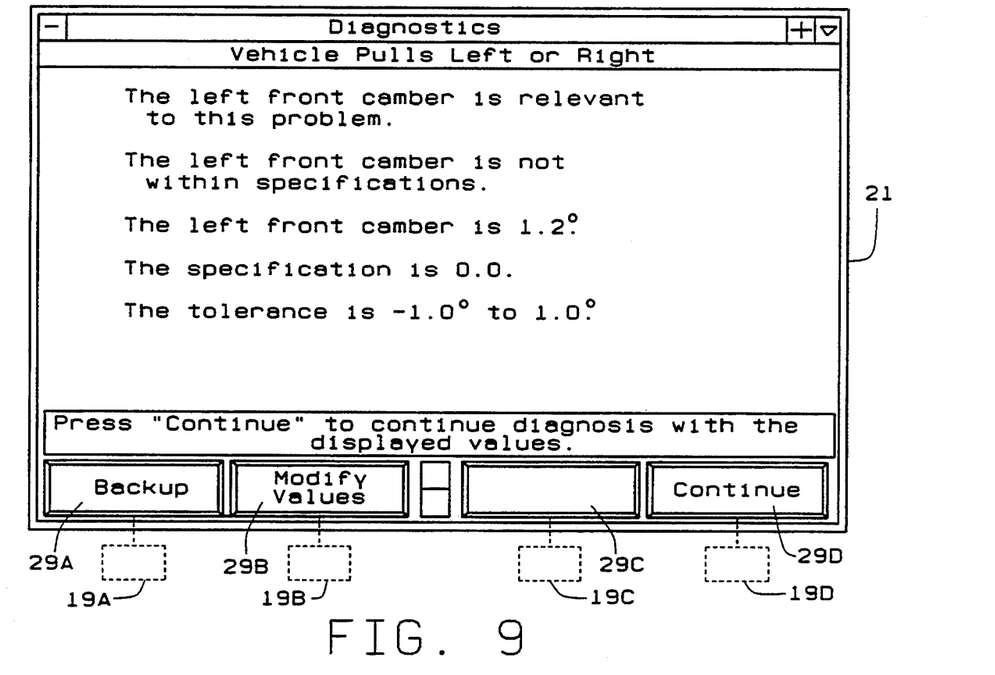

The technician would usually press switch 19D to Continue with the diagnosis when he/she sees such a screen. However the technician could press switch 19B (associated with the legend "Modify Values") to change the camber value, the specification, or the tolerance. If the technician pressed "Modify Values," the screen would change to an edit screen, in which the technician uses a tab key (not shown) to move between the camber value, the specification, and the tolerance. The technician could change any of the values before pressing switch 19D to continue. The diagnostic system would use the altered values as it tries to determine the cause of the problem. If the technician alters the specification or the tolerance, the modified values will only be used within the diagnostic mode of system 11.

Figure 10:
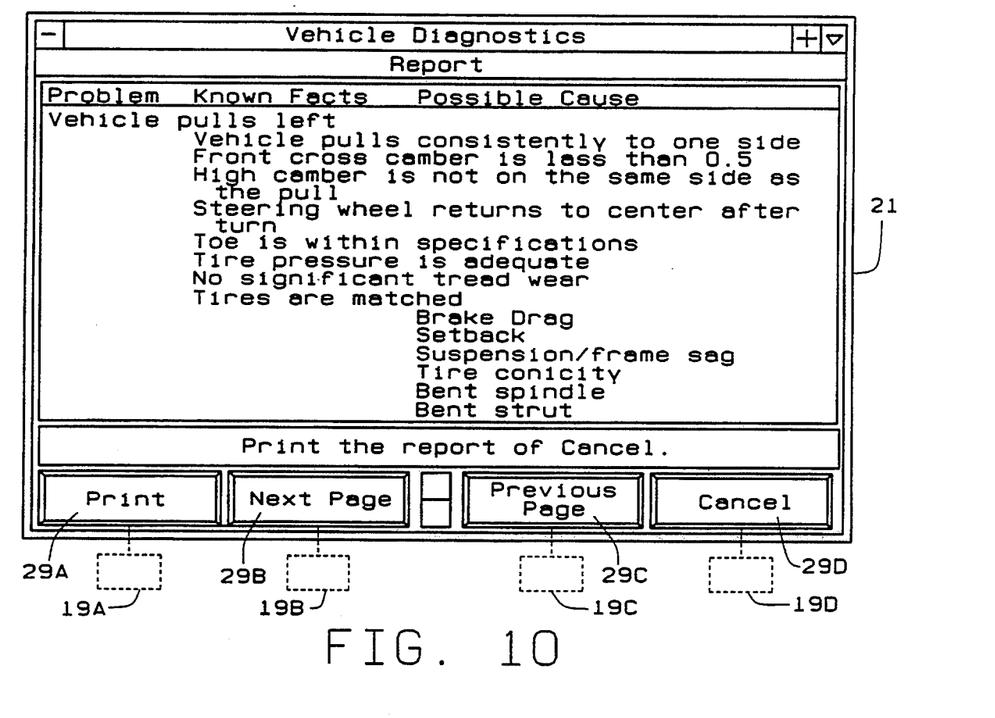

Once microcomputer 22 has reached a diagnosis, it displays a report to the technician, such as that shown in FIG. 10. The technician may also produce this report at any time by selecting "Report" from the soft keys on any diagnostic screen. The technician may view this report on screen 21 or print it on printer 24 (by pressing switch 19A). The report presents all the facts known by the system and all the possible cause of the problem in order of decreasing probability.

System 11 is able to diagnose a finite set of problems. For each of the problems there will be a finite number of causes that the diagnostic system understands. For example the diagnostic system is able to handle problems such as the following:

Pull Left/Right
Centerline Steering Error
Shimmy
Vibration
Hard Steering
Loose Steering
etc.

For the "Pull Left/Right" problem, the diagnostic system will understand a fixed number of causes, such as:

Uneven tire pressure
Uneven tread wear
Mismatched tires
Uneven Camber
Uneven caster
Brake drag
Setback
Suspension/frame sag
Tire conicity
Unbalanced power assist
Bent spindle
Bent strut
Worn suspension components (front/rear)
Rear suspension misalignment In performing the actual diagnosis, microcomputer 22 operates using a process of elimination. When the technician first identifies the problem, microcomputer 22 considers all of the potential causes for the problem as "Possible Causes." If the technician requests a report before he/she had answered any questions about a problem, then microcomputer 22 reports all of the potential causes of a problem as "Possible Causes". As the technician answers questions and performs diagnostic procedures, and as the diagnostic system gathers measurement information, the number of possible causes is reduced. Microcomputer 22 asks questions that will eliminate each possible cause in an effort to determine a single cause of the problem.

Note that the present system is not limited to use with sensors 25. For example, the technician could perform a diagnosis on a vehicle, by inspecting it "off of the rack" without measurement information. The technician could answer any of the questions that do not involve measurements. Microcomputer 22 is able to eliminate many of the possible causes and provide a useful list of the remaining possible causes for the technician.

In some instances it is possible that the diagnostic system of the present invention will not be able to identify the cause of the problem. Microcomputer 22 in that case tries to eliminate all of the causes of a problem that it can. If all the possible causes programmed in microcomputer 22 are eliminated, then it reports to the technician that the cause of the problem is unknown.

In the event that a second diagnosis is performed on the same vehicle, microcomputer 22 re-asks all questions relevant to any problem even if the questions have already been asked for another problem.

In view of the above, it will be seen that the various objects and features of the present invention are achieved and other advantageous results obtained. It will be understood that the various embodiments of the present invention described herein are illustrative only and are not to be taken in a limiting sense.

What is claimed is:

1. A vehicle wheel alignment diagnostic system comprising:
   an electronic controller for guiding a user through a series of diagnostic steps to determine likely causes for at least one predetermined vehicle symptom;
   vehicle wheel alignment measuring instruments for determining wheel alignment data for at least one wheel of said vehicle;
   an input device manually operable by a user for providing input from the user to the electronic controller, said input ,device being operable by the user to identify at least one particular symptom which the user desires to diagnose;
   a digital memory for storing a a plurality of likely causes for each of a predetermined number of selectable symptoms;
   a display operatively connected to the electronic controller for displaying diagnostic questions to the user, said electronic controller being responsive to the selection of a particular symptom to cause the display to display at least one diagnostic question associated with that symptom to the user, said input device being operable by the user to supply an answer to the diagnostic question to the electronic controller, said electronic controller being responsive to user provided input in response to at least one diagnostic question, to the likely causes stored in the digital memory, and to data from the vehicle wheel alignment measuring instruments to eliminate at least one likely cause of a symptom from consideration and identify any remaining likely causes of the symptom.

2. The vehicle wheel alignment diagnostic system as set forth in claim 1 wherein identifying information for a plurality of predetermined diagnostic procedures is stored therein, said electronic controller including means to cause the display of identifying information to the user to perform one of the a diagnostic procedure procedures, the particular identified diagnostic procedure being selected by the electronic controller to assist in the elimination of at least one likely cause of the selected symptom.

3. The vehicle wheel alignment diagnostic system as set forth in claim 2 wherein the identified diagnostic procedure is selected by the electronic controller to maximize the elimination of possible causes of the selected symptom.

4. The vehicle wheel alignment diagnostic system as set forth in claim 2 wherein each diagnostic procedure has at least one possible result, the electronic controller being responsive to the result of the selected diagnostic procedure to eliminate possible causes of the symptom from consideration.

5. The vehicle wheel alignment diagnostic system as set forth in claim 1 wherein the electronic controller is programmed such that said controller causes the display of the least possible number of diagnostic questions to the user consistent with the particular answers to the diagnostic questions supplied by the user.

6. The vehicle wheel alignment diagnostic system as set forth in claim 1 wherein the electronic controller is under programmed control such that in response to answers to at least one diagnostic question the controller causes the display of an additional diagnostic question preselected to maximize the elimination of probable causes of the selected symptom from consideration.

7. The vehicle wheel alignment diagnostic system as set forth in claim 1 wherein the electronic controller is responsive to a predetermined user input from the input device to cause the display of a diagnosis report for use by the user.

8. The vehicle wheel alignment diagnostic system as set forth in claim 7 wherein the diagnosis report includes a list of all known facts concerning the diagnosis.

9. The vehicle wheel alignment diagnostic system as set forth in claim 7 wherein the diagnosis report includes a list of possible causes of the selected symptom, said possible causes excluding those possible causes inconsistent with user supplied answers to diagnostic questions.

10. The vehicle wheel alignment diagnostic system as set forth in claim 9 wherein the list of possible causes is displayed in order of probability of being the actual cause.

11. The vehicle wheel alignment diagnostic system as set forth in claim 7 wherein the diagnosis report is automatically displayed when the electronic controller reaches a diagnosis of the selected symptom.

12. The vehicle wheel alignment diagnostic system as set forth in claim 1 wherein the electronic controller includes a diagnostic mode and at least a second mode other than the diagnostic mode, and wherein the digital memory includes means for storing answers to diagnostic questions supplied by the user while the electronic controller is in the diagnostic mode for use during the second mode of the electronic controller.

13. The vehicle wheel alignment diagnostic system as set forth in claim 12 wherein the electronic controller includes means for accessing the stored answers to diagnostic questions upon a return to the diagnostic mode.

14. The vehicle wheel alignment diagnostic system as set forth in claim 12 wherein the vehicle wheel alignment measuring instruments acquire said alignment data in the second mode, said electronic controller being responsive to the alignment to include said measured alignment data in diagnosing the selected symptom.

15. The vehicle wheel alignment diagnostic system as set forth in claim 14 wherein the electronic controller is responsive to exiting from the diagnostic mode to utilize new measurements of measured alignment information upon reentry into the diagnostic mode.

16. The vehicle wheel alignment diagnostic system as set forth in claim 14 wherein the electronic controller is under programmed control to acquire measured alignment information directly and automatically from the measuring instruments.

17. The vehicle wheel alignment diagnostic system as set forth in claim 16 wherein during use of measured alignment information from the vehicle wheel alignment measuring instruments, the electronic controller causes the display to inform the user of the use of said measured alignment information.

18. The vehicle wheel alignment diagnostic system as set forth in claim 14 wherein the electronic controller causes the measured alignment information values used in the diagnosis to be displayed to the user.

19. The vehicle wheel alignment diagnostic system as set forth in claim 14 wherein the input device includes manually operable means for modifying the measured alignment data values used in the diagnosis.

20. The vehicle wheel alignment diagnostic system as set forth in claim 1 wherein the digital memory includes means for storing database information concerning vehicle alignment specifications, models and makes, said electronic controller being responsive to said stored database information to select particular diagnostic questions to display to the user and to eliminate possible causes of the selected symptom from consideration based upon the stored database information.

21. The vehicle wheel alignment diagnostic system as set forth in claim 1 wherein the electronic controller includes a diagnostic mode and at least an inspection mode, said electronic controller being responsive to entry into the diagnostic mode to use information acquired in the inspection mode in eliminating possible causes of the selected symptom from consideration.

22. The vehicle wheel alignment diagnostic system as set forth in claim 1 wherein the electronic controller has associated with at least one symptom a definition of that symptom, the electronic controller being responsive to the selection of that symptom to cause the display of the definition of the selected symptom.

23. The vehicle wheel alignment diagnostic system as set forth in claim 1 wherein at least one of the selectable symptoms has a visual representation thereof associated therewith, the electronic: controller being responsive to the selection of a selectable symptom having a visual representation associated therewith to cause the display of said visual representation on the display.

24. The vehicle wheel alignment diagnostic system as set forth in claim 23 wherein at least one of the visual representations includes a plurality of said representations from which the user can select, the input device being usable by the user to select from the plurality of visual representations the one visual representation most closely approximating the symptom of the vehicle under test.

25. The vehicle wheel alignment diagnostic system as set forth in claim 1 further including a printer under control of the electronic controller, the electronic controller being responsive to a request from the user via the input device to cause the printer to print a checklist of items to be examined on the vehicle corresponding to the selected symptom.

26. The vehicle wheel alignment diagnostic system as set forth in claim 1 wherein at least one of the diagnostic questions has associated therewith at least one visual image, said electronic controller causing the display of those visual images corresponding to a displayed diagnostic question, further includes means for highlighting at least some portion of said visual image.

27. The vehicle wheel alignment diagnostic system as set forth in claim 26 wherein at least one of the visual images is a digitized photograph.

28. The vehicle wheel alignment diagnostic system as set forth in claim 1 wherein the input device includes means for requesting a restart of a diagnosis, the electronic controller being responsive to the request for a restart of a diagnosis to eliminate from consideration answers to diagnostic questions already supplied before the restart request and to cause the display of at least one of the previously asked diagnostic questions.

29. The vehicle wheel alignment diagnostic system as set forth in claim 1 wherein the electronic controller is responsive to the elimination of all stored possible causes for a selected symptom to cause the display of the cause as unknown to the user.

30. The vehicle wheel alignment diagnostic system as set forth in claim 1 further including means for storing measured alignment information for the vehicle under test, the electronic controller being responsive to the values of the stored measured alignment information and to the answers to diagnostic questions to generate a diagnosis of the selected symptom.

31. The vehicle wheel alignment diagnostic system as set forth in claim 1 wherein the electronic controller is responsive to the subsequent selection of a second symptom by the user to eliminate from consideration the answers to diagnostic questions for the first selected symptom, whereby if any diagnostic question for the second symptom is identical to an answered diagnostic question for the first symptom, the electronic controller will cause the re-display of said diagnostic question to obtain a new answer thereto from the user.

32. A method of diagnosing predetermined vehicle symptoms, said method comprising:
prestoring in a digital memory a knowledge base of information with respect to diagnosing vehicle symptoms, said knowledge base electronically utilizable to diagnose likely causes of vehicle symptoms;
measuring alignment angles of the wheels of a vehicle using vehicle wheel alignment measuring instruments;
selecting at least one of said predetermined vehicle symptoms to be diagnosed;
visually displaying to a user at least one of a plurality of predetermined diagnostic questions to be answered by the user;
electronically utilizing the answers supplied by the user and the wheel alignment measurements from the measuring instruments to eliminate from consideration at least one likely cause of a selected symptom to be diagnosed and identify any remaining likely causes of the symptom.

33. The method of diagnosing vehicle symptoms as set forth in claim 32 further including the step of visually instructing the user to perform a diagnostic procedure, the particular identified diagnostic procedure being selected to assist in the elimination of possible causes of the selected symptom.

34. The method of diagnosing vehicle symptoms as set forth in claim 33 wherein the visually identified diagnostic procedure is selected to maximize the elimination of possible causes of the selected symptom.

35. The method of diagnosing vehicle symptoms as set forth in claim 32 wherein a minimum number of diagnostic questions are displayed to the user consistent with the particular answers to the diagnostic questions supplied by the user.

36. The method of diagnosing vehicle symptoms as set forth in claim 32 wherein, in response to a particular set of answers to a series of diagnostic questions, an additional diagnostic question preselected to maximize the elimination of probable causes of the selected symptom from consideration is displayed.

37. The method of diagnosing vehicle symptoms as set forth in claim 32 including displaying a list of possible causes of the selected symptom in order of probability of being the actual cause.

38. The method of diagnosing vehicle symptoms as set forth in claim 32 wherein during acquisition of measured alignment information from the vehicle wheel alignment measuring instruments, the user is visually informed of the acquisition of said measured alignment information.

39. The method of diagnosing vehicle symptoms as set forth in claim 38 including manually modifying the measured alignment information values used in the diagnosis.

40. The method of diagnosing vehicle symptoms as set forth in claim 32 including prestoring database information concerning vehicle alignment specifications, models and makes, and selecting particular diagnostic questions to display to the user and to eliminate possible causes of the selected symptom from consideration based upon the stored database information.

41. The method of diagnosing vehicle symptoms as set forth in claim 32 wherein at least one of the selectable symptoms has a visual representation thereof associated therewith, further including, in response to the selection of a selectable symptom having a visual representation associated therewith, the step of displaying said visual representation.

42. The method of diagnosing vehicle symptoms as set forth in claim 41 wherein at least one of the visual representations includes a plurality of said representations from which the user can select, further including the step of manually selecting from the plurality of displayed visual representations the one visual representation most closely approximating the symptom of the vehicle under test.

43. The method of diagnosing vehicle symptoms as set forth in claim 32 further including storing measured alignment information for the vehicle under test, and, in response to the values of the stored measured alignment information and to the answers to diagnostic questions, generating a diagnosis of the selected symptom.

44. A vehicle wheel alignment diagnostic system comprising:
an electronic controller for guiding a user through a series of diagnostic steps to determine likely causes for at least one predetermined vehicle symptom;
an input device manually operable by a user for providing at least one of a plurality of predetermined inputs from the user to the electronic controller, said input device being operable by the user to identify at least one symptom which the user desires to diagnose;
a digital memory for storing a set of at least one likely cause for each selectable symptom;

a display operatively connected to the electronic controller for displaying diagnostic questions and instructions to perform diagnostic procedures to the user; and means for storing identification of at least one diagnostic procedure, said electronic controller including means to cause the display of an instruction to the user to perform a diagnostic procedure;

said electronic controller being responsive to the selection of a predetermined symptom to cause the display to display at least one diagnostic question associated with that symptom to the user, said input device being operable by the user to supply an answer to the diagnostic question to the electronic controller;

said electronic controller being responsive to user provided input in response to at least one diagnostic question and to the result of the identified diagnostic procedure to eliminate at least one likely cause of the selected symptom from consideration and identify any remaining likely causes of the symptom.

45. The vehicle wheel alignment diagnostic system as set forth in claim 44 wherein the identified diagnostic procedure is selected by the electronic controller to maximize the elimination of possible causes of the selected symptom.

46. The vehicle wheel alignment diagnostic system as set forth in claim 44 wherein the electronic controller is responsive to a particular user input to cause the display of a diagnosis report for use by the user, said diagnosis report including a list of possible causes of the selected symptom, said possible causes excluding those inconsistent with user supplied answers to diagnostic questions and with the result of the user performed diagnostic procedure.

47. The vehicle wheel alignment diagnostic system as set forth in claim 44 wherein the digital memory includes means for storing database information concerning vehicle alignment specifications, models and makes, said electronic controller being responsive to said stored database information to select particular diagnostic questions and diagnostic procedures to display to the user and to eliminate possible causes of the selected symptom from consideration based upon the stored database information.

48. The vehicle wheel alignment diagnostic system as set forth in claim 44 wherein the electronic controller includes a diagnostic mode and at least an inspection mode, said electronic controller being responsive to entry into the diagnostic mode to use information acquired in the inspection mode in eliminating possible causes of the selected symptom from consideration.

49. The vehicle wheel alignment diagnostic system as set forth in claim 44 further including a printer under control of the electronic controller, the electronic controller being responsive to a request from the user via the input device to cause the printer to print a checklist of items to be examined on the vehicle corresponding to the selected symptom.

50. The vehicle wheel alignment diagnostic system as set forth in claim 44 wherein the input device includes means for requesting a restart of a diagnosis, the electronic controller being responsive to the request for a restart of a diagnosis to eliminate from consideration answers to diagnostic questions and results of diagnostic procedures already supplied before the restart request and to cause the display of at least some of the previously asked diagnostic questions.

51. The vehicle wheel alignment diagnostic system as set forth in claim 44 wherein the electronic controller is responsive to the subsequent selection of a second symptom by the user to eliminate from consideration the results of diagnostic procedures for the first selected symptom, whereby if any diagnostic procedure for the second symptom is identical to a diagnostic procedure for the first symptom, the electronic controller will cause the re-display of instructions to perform the diagnostic procedure to obtain a new result therefor from the user.

52. A method of diagnosing predetermined vehicle symptoms, said method comprising:

prestoring in a digital memory a knowledge base of information with respect to diagnosing said predetermined vehicle symptoms, said knowledge base being electronically utilizable to diagnose likely causes of vehicle symptoms;

selecting at least one of said predetermined vehicle symptoms to be diagnosed;

visually displaying to a user a series of diagnostic questions to be answered by the user and instructions to perform at least one diagnostic procedure;

electronically utilizing the answers and the result of the diagnostic procedure supplied by the user to eliminate from consideration at least one likely cause of the selected symptom to be diagnosed and identify remaining likely causes of the symptom.

53. The method of diagnosing vehicle symptoms as set forth in claim 52 wherein the visually identified diagnostic procedure is selected to maximize the elimination of possible causes of the selected symptom.

54. The method of diagnosing vehicle symptoms as set forth in claim 52 wherein a minimum number of diagnostic questions and diagnostic procedure instructions are displayed to the user consistent with the particular answers to the diagnostic questions and particular results of the diagnostic procedures supplied by the user.

55. The method of diagnosing vehicle symptoms as set forth in claim 52 including prestoring database information concerning vehicle alignment specifications, models and makes, and selecting a particular diagnostic procedure to perform to eliminate possible causes of the selected symptom from consideration based upon the stored database information.

56. The method of diagnosing vehicle symptoms as set forth in claim 52 wherein at least one of the selectable symptoms has a visual representation thereof associated therewith, further including, in response to the selection of a selectable symptom having a visual representation associated therewith, the step of displaying said visual representation.

57. The method of diagnosing vehicle symptoms as set forth in claim 56 wherein at least some of the visual representations include a plurality of said representations from which the user can select, further including the step of manually selecting from the plurality of displayed visual representations the one visual representation most closely approximating the symptom of the vehicle under test.

* * * * *